(12) United States Patent
Feng

(10) Patent No.: US 7,030,644 B2
(45) Date of Patent: Apr. 18, 2006

(54) LOW REFLECTION DRIVER FOR A HIGH SPEED SIMULTANEOUS BIDIRECTIONAL DATA BUS

(75) Inventor: Kai D. Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/771,826

(22) Filed: Feb. 3, 2004

(65) Prior Publication Data

US 2005/0168239 A1   Aug. 4, 2005

(51) Int. Cl.
*H03K 19/003* (2006.01)

(52) U.S. Cl. .............................. 326/30; 326/86; 326/87

(58) Field of Classification Search ............ 326/30–34, 326/26–27, 86–87, 90–91; 327/108–112
See application file for complete search history.

(56) References Cited

U.S. PATENT DOCUMENTS

| | | | |
|---|---|---|---|
| 5,578,939 A | 11/1996 | Beers et al. | |
| 5,602,494 A * | 2/1997 | Sundstrom | 326/39 |
| 5,742,183 A * | 4/1998 | Kuroda | 326/81 |
| 5,793,223 A | 8/1998 | Frankeny | |
| 5,955,911 A | 9/1999 | Drost et al. | |
| 6,051,990 A | 4/2000 | Uber | |
| 6,404,223 B1 | 6/2002 | Degerstrom et al. | |
| 6,509,755 B1 | 1/2003 | Hernandez-Marti | |
| 6,853,213 B1 * | 2/2005 | Funaba | 326/30 |

* cited by examiner

*Primary Examiner*—Anh Q. Tran
(74) *Attorney, Agent, or Firm*—Scully, Scott, Murphy & Presser; William H. Steinberg

(57) ABSTRACT

A low reflection driver is provided for a high speed simultaneous bi-directional transmission line/data bus which is designed such that units at both ends of the transmission line/data bus can transmit data at any time without waiting for the bus to become available so that the baud rate of the bus is increased. A push-pull current source driver for the bi-directional simultaneous data bus provides greater flexibility for an output voltage swing, a matching impedance and bandwidth compensation.

24 Claims, 2 Drawing Sheets

LOW REFLECTION DRIVER FOR A HIGH SPEED SIMULTANEOUS BIDIRECTIONAL DATA BUS

BACKGROUND OF THE INVENTION

1. Field of the Invention

The present invention relates generally to a low reflection driver for a high speed simultaneous bi-directional transmission line/data bus which is designed such that units at both ends of the transmission line/data bus can transmit data at any time without waiting for the bus to become available so that the baud rate of the bus is increased. The present invention also relates generally a PCB (printed circuit board) having thereon at least the low reflection driver for the high speed simultaneous bi-directional transmission line/data bus and a method of transmitting high speed simultaneous bi-directional data over a transmission line/data bus.

A push-pull current source driver for the bi-directional simultaneous data bus provides greater flexibility for an output voltage swing, a matching impedance and bandwidth compensation. The push-pull current source driver minimizes external components such as an analog delay line and provides an easy PCB (printed circuit board) design.

2. Discussion of the Prior Art

FIG. 1 illustrates a conventional simultaneous bi-directional data bus structure and system consisting of identical units, Unit A and Unit B, at opposite ends of a data bus/transmission line TL having a characteristic impedance Z0. Each unit has a driver and a receiver.

The driver is similar to an inverter with two resistors wherein Rpa=Rna=Rpb=Rnb=Z0, the characteristic impedance of the transmission line TL. Pa, Pb are pfets, and Na and Nb are nfets.

Table 1 (second and third lines) shows the voltages at CA and CB when Va and Vb are at different logic states.

TABLE 1

| Va | Vb | Pa | Na | Pb | Nb | CA | CB | |
|---|---|---|---|---|---|---|---|---|
| Logic 0 (0 V) | Logic 0 (0 V) | ON | OFF | ON | OFF | Vcc | Vcc | State 0 |
| Logic 0 (0 V) | Logic 1 (Vcc) | ON | OFF | OFF | ON | Vcc/2 | Vcc/2 | State 1 |
| Logic 1 (Vcc) | Logic 0 (0 V) | OFF | ON | ON | OFF | Vcc/2 | Vcc/2 | State 2 |
| Logic 1 (Vcc) | Logic 1 (Vcc) | OFF | ON | OFF | ON | 0 | 0 | State 3 |

In operation, unit A can detect the logic signal Vb sent from the unit B based on the voltage on CA and the logic state at Va, e.g. if Va=0 and CA is Vcc, Vb is determined as logic 0 (State 0), and if Va=1 and CA is 0, Vb is determined as logic 1 (State 3).

The problems with the prior art driver structure are:

1. Impedance Mismatch: When the data rate is high, the impedance match of the transmission line TL and the termination is very important. If the impedances are mismatched, reflection occurs, which seriously increases jitter and error bits. When Va or Vb are at Vcc or 0V, the transmission line TL has a good impedance match because Rpa=Rna=Rpb=Rnb=Z0, the nfet is turned on completely, presenting a very low impedance, the pfet is cut off, presenting a very high impedance, or the nfet is cut off, presenting a very high impedance, and the pfet is turned on completely, presenting a very low impedance. But when the voltage on Va or Vb sweeps across Vcc/2, both the nfet and the pfet are in a saturation mode, presenting a high impedance, and the termination impedance at that moment is much higher than Z0 the characteristic impedance of TL. If at that moment, a transition arrives at CA or CB, the impedance mismatch results in a large reflection. A problem with impedance matching in the simultaneous bi-directional data bus occurs when an input signal edge arrives at the same time the driver is switching states, which results in the output impedance mismatching the transmission line characteristic impedance, resulting in a serious signal reflection.

2. Parasitic Capacitance: Parasitic capacitance on CA or CB increases the coming signal rise time and fall time, resulting in increased jitter.

SUMMARY OF THE INVENTION

The present invention provides a push-pull current source driver for a bi-directional simultaneous data bus that has very low reflection and provides greater flexibility for an output voltage swing, a matching impedance and bandwidth compensation. The push-pull current source driver minimizes external components such as an analog delay line and provides an easy PCB (printed circuit board) design.

DETAILED DESCRIPTION OF THE INVENTION

Figure 1:
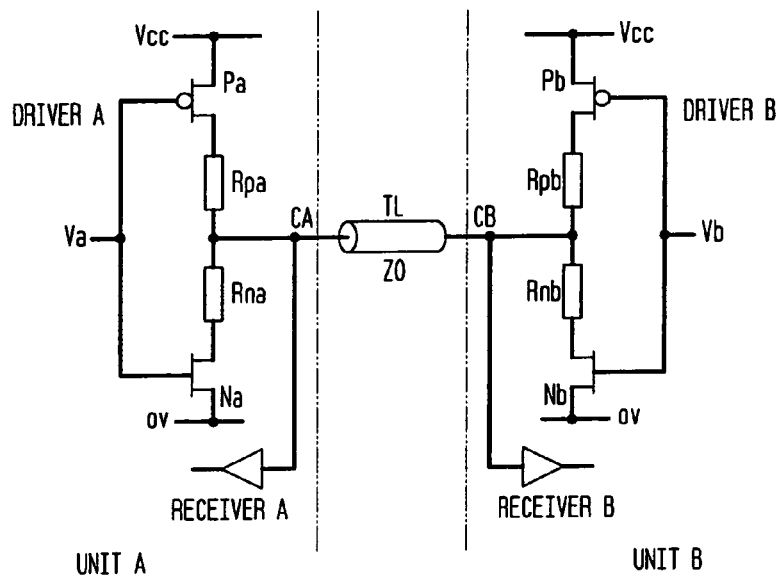
FIG. 1 illustrates a conventional simultaneous bi-directional data bus structure and system consisting of identical units, Unit A and Unit B, at opposite ends of a data bus/transmission line TL having a characteristic impedance Z0.
Figure 2:
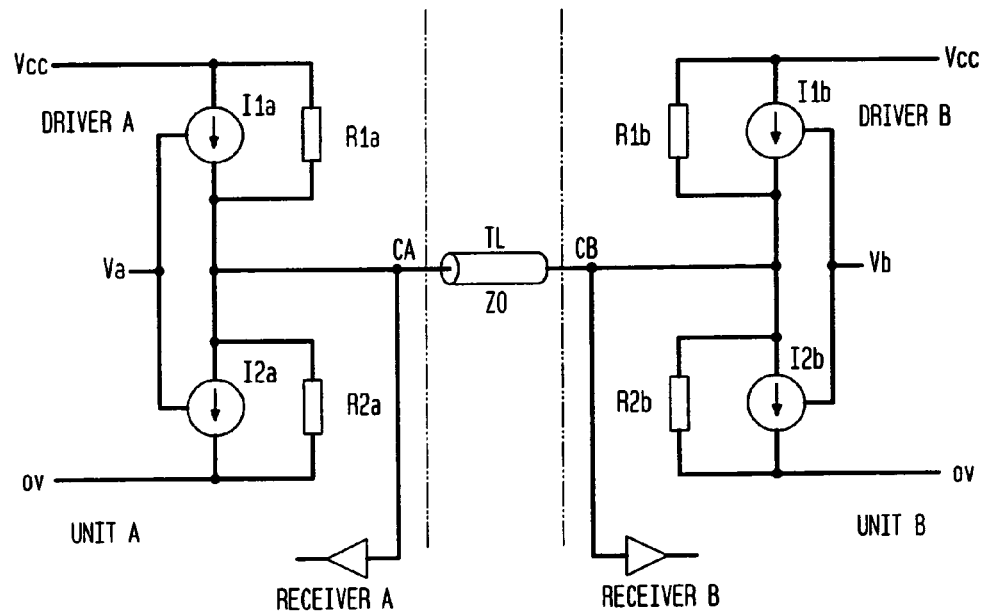
FIG. 2 illustrates a simultaneous bi-directional data bus structure and system pursuant to the present invention consisting of identical units, Unit A and Unit B, at opposite ends of a data bus/transmission line TL, each having switching current sources.

The present invention provides a new driver structure as shown in FIG. 2 to solve the problems of impedance mismatch and parasitic capacitance.

FIG. 2 illustrates a simultaneous bi-directional data bus structure and system pursuant to the present invention consisting of identical units, Unit A and Unit B, at opposite ends of a data bus/transmission line TL, each having switching current sources. Each unit has a driver and a receiver, and the output of the receiver is directed to a post process circuit as is known in the art.

In operation, unit A can detect the logic signal Vb sent from the unit B based on the voltage on CA and the logic state at Va. Referring to Table 2 below, e.g. if Va=0 and CA is Vcc/2, Vb is determined as logic 0 (State 1), and if Va=1 and CA is Vcc/2, Vb is determined as logic 1 (State 3).

In the new driver structure of FIG. 2, R1$a$=R2$a$=R1$b$=R2$b$=2 Z0, and I1$a$, I2$a$, I1$b$ and I2$b$ are switching current sources. I1$a$ and I1$b$ are identical sourcing current sources, and I2$a$ and I2$b$ are identical sinking current sources. The input VA controls the turn on/off of I1$a$ and I2$a$, each of which has transition compensation. The input Vb controls the turn on/off of I1b and I2b, each of which has transition compensation. I1a, I2a, I1b and I2b provide the same amount of current I0.

Similar to Table 1, Table 2 shows the operation of the new driver.

changes to different voltage levels, the impedance is always constant and is equal to the characteristic impedance. Also current technologies provide resistors with a very low temperature coefficient such as 1e−4/C°, so the resistance is quite stable with temperature variation. If required, a zero

| Va | Vb | I1a | I2a | I1b | I2b | CA | CB | |
|---|---|---|---|---|---|---|---|---|
| Logic 0 (0 V) | Logic 0 (0 V) | ON | OFF | ON | OFF | Vcc/2 + I0 * Z0 | Vcc/2 + I0 * Z0 | State 0 |
| Logic 0 (0) | Logic 1 (Vcc) | ON | OFF | OFF | ON | Vcc/2 | Vcc/2 | State 1 |
| Logic 1 (Vcc) | Logic 0 (0 V) | OFF | ON | ON | OFF | Vcc/2 | Vcc/2 | State 2 |
| Logic 1 (Vcc) | Logic 1 (Vcc) | OFF | ON | OFF | ON | Vcc/2 − I0 * Z0 | Vcc/2 − I0 * Z0 | State 3 |

According to the network theory, on A side, the impedance terminating the transmission line TL is R1a, R2a, I1a and I2a in parallel, on B side the impedance terminating the transmission line TL is R1b, R2b, I1b and I2b in parallel. Since the current sources always present a high impedance, the terminal impedances at CA and CB are determined substantially solely by respectively R1a and R2a in parallel, and R1b and R2b in parallel, and are always at the characteristic impedance Z0 of the transmission line TL because R1a, R2a, R1b R2b have the resistance of 2 Z0, such that the transmission line TL has a good impedance match at both ends.

The voltage swing at CA, CB is 2*I0*Z0, which can be adjusted by changing the value of the current I0 to meet the requirement of a LVDS (low voltage digital system) for high data rate systems.

The high speed simultaneous bi-directional driver at each terminal end of the transmission line TL comprises a p side driver and an n side driver, which are serially connected between the voltage supply Vcc and ground, with the connection between the serially connected drivers being connected to the transmission line. Each of the drivers has an output impedance of twice the characteristic impedance Z0 of the transmission line so that the total output impedance of the driver matches the transmission line characteristic impedance. Each driver unit has a resistor having a resistance value of twice the transmission line characteristic impedance and a switching current source in parallel. Since the impedance of a current source is much higher than the impedance of the resistor, the total impedance of the driver is always substantially equal to the characteristic impedance regardless of whether the current course is turned on or off so that the driver has excellent impedance matching and very low signal reflection at all times including when an input signal arrives at the same time the driver is switching states.

Resistors with zero voltage coefficient and low temperature coefficient should be selected for R1a, R2a, R1b and R2b in FIG. 2. For applications with a large environmental temperature range, each of the resistors R1a, R2a, R1b and R2b can consist of two resistors in series with opposite temperature coefficients so that a zero or very low temperature coefficient can be obtained.

The resistors of current technologies have almost a zero voltage coefficient (for example, Salicide-blocked and salicided resistors) so that when the signal voltage transients or resistance temperature coefficient can be attained by using two resistors with opposite sign temperature coefficients in series.

A set of programmable compensation capacitors Cn1, Cn2, Cnk, or Cp1, Cp2, Cpk, are provided in the driver to compensate for parasitic capacitance and to accelerate transitions to higher speeds.

In very high speed applications, the parasitic capacitance may slow down the rising and falling edges of the current switching, and a voltage follower and current source trigger can be used to compensate for the parasitic capacitance of the current source.

The push-pull current source driver illustrated in FIG. 2 minimizes external components required in prior art circuits, such as a large and expensive programmable bi-directional analog delay line, which made the prior art circuits difficult to implement on a PCB (printed circuit board) design. The push-pull current source driver illustrated in FIG. 2 eliminates the large programmable bi-directional analog delay line, and accordingly provides an easy PCB (printed circuit board) design. A PCB design might incorporate all of the components illustrated in FIG. 2 mounted on a single PCB, or unit A could be provided on a first PCB connected by the transmission line TL to unit B provided on a second PCB.

Figure 3:
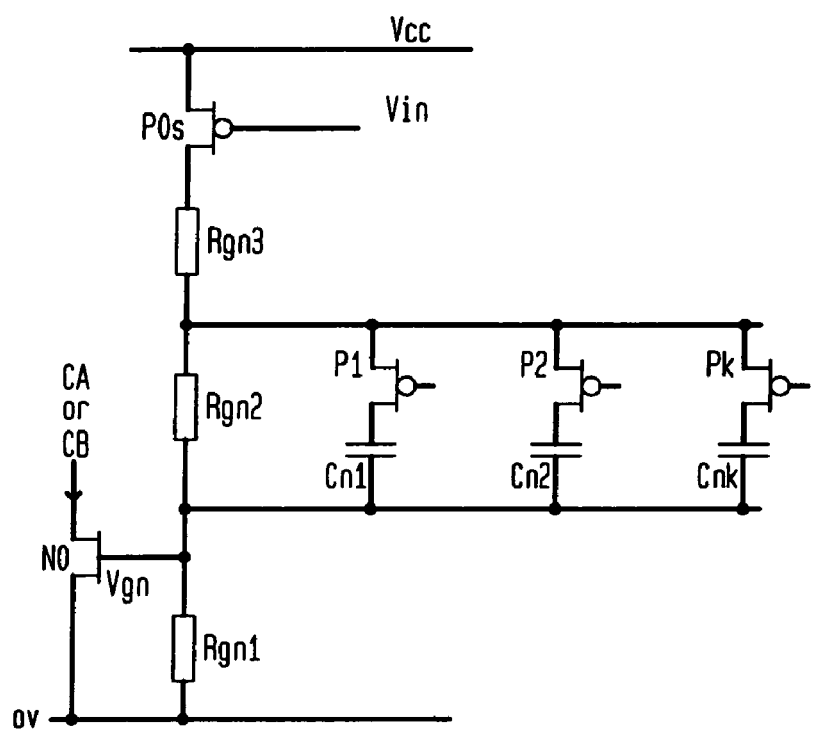
FIG. 3 is a detailed schematic of a sinking current source pursuant to the present invention.
Figure 4:
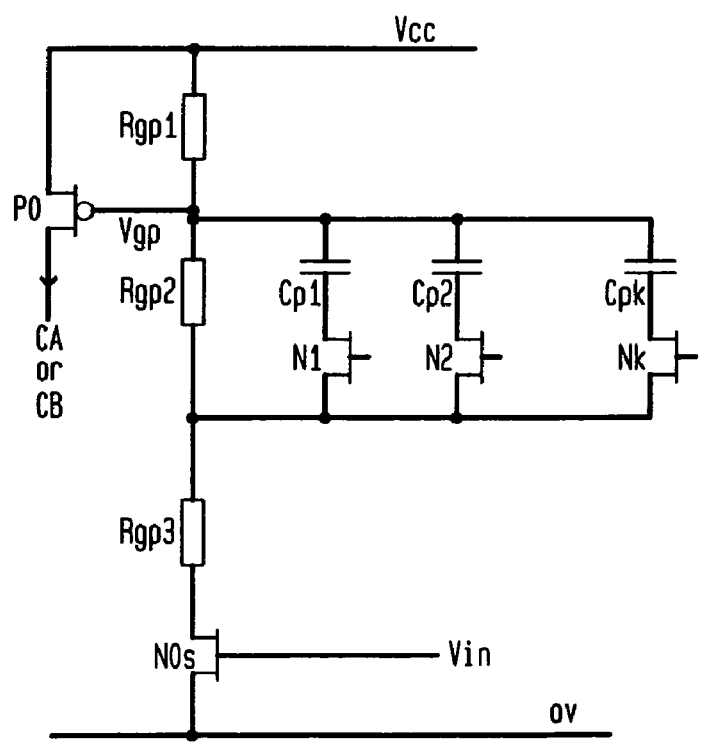
FIG. 4 is a detailed schematic of a sourcing current source pursuant to the present invention.

FIG. 3 is a detailed schematic of a sinking current source, and FIG. 4 is a detailed schematic of a sourcing current source. The circuit of FIG. 4 is similar to the circuit of FIG. 3, but the pfets and nfets are reversed.

Referring to FIG. 3, each sinking current source includes a pfet device P0s, with its gate coupled to Vin, is coupled to the power supply Vcc, with the pfet device being coupled through first, second and third resistors Rgn1, Rgn2 and Rgn3 to ground 0V, with a plurality of programmable pfet devices P1, P2, Pk and series connected compensating capacitors Cn1, Cn2, Cnk being connected in parallel with the second resistor Rgn2, and the connection between the first and second resistors Rgn1, Rgn2 being connected to the gate of an nfet device N0.

In FIG. 3, N0 is the main nfet with the source connecting to 0V and the drain connecting to CA or CB, and the gate-source voltage Vgn=Vcc*Rgn1/(Rgn1+Rgn2+Rgn3) when Vin is at logic 0 and P0s is turned on.

The width and length of N0 and the values of Rgn1, Rgn2 and Rgn3 are chosen to meet the following requirements:

1. Ids of N0 is I0 when Vgn1=Vcc*Rgn1/(Rgn1+Rgn2+Rgn3).

2. Vgn1−Vthn (the threshold voltage of N0)<(Vcc−I0*Z0)/2, so that N0 is at a saturation region/mode when it is turned on.

Cn1, Cn2 . . . Cnk are a set of preset compensation capacitors. When a logic low is applied to one or more of the gates of P1, P2 . . . Pk, the corresponding capacitors are selected. At the moment when Vin is transiting from a logic high to a logic low, the resistor Rgn2 is shorted by the compensation capacitors temporally, the gate voltage of N0 can reach the peak value of Vgn2 at that moment, then the gate voltage of N0 decays to Vgn1.

*Vgn2=Vcc\*Rgn1/(Rgn1+Rgn3)*.

The peak voltage can compensate for the parasitic capacitance of N0 and decrease the current rising time of N0. It should be noted that Vgn2 must meet the requirement of

*Vgn2−Vthn<(Vcc−I0\*Z0)/2 so that N0 is at saturation region*.

Referring to FIG. 4, each sourcing current source includes an nfet device N0s, with its gate coupled to Vin, is coupled to ground 0V, with the nfet device being coupled through first, second and third resistors Rgp1, Rgp2, Rgp3 to the power supply Vcc, with a plurality of programmable nfet devices N1, N2, Nk and series connected compensating capacitors Cp1, Cp2, Cpk being connected in parallel with the second resistor Rgp2, and the connection between the first and second resistors being connected to the gate of a pfet device P0.

In FIG. 4, P0 is the main pfet with the source connecting to Vcc and the drain connecting to CA or CB, the gate-source voltage Vgp=Vcc*Rgp1/(Rgp1+Rgp2+Rgp3) when Vin is at logic 1 and N0s is turned on. The width and length of P0 and the values of Rgp1, Rgp2 and Rgp3 are selected to meet the following requirements.

1. Ids of P0 is I0 when Vgp1=Vcc*Rgp1/(Rgp1+Rgp2+Rgp3).
2. Vgp1−Vthp<(Vcc−I0*Z0)/2, where Vthp is the threshold voltage of P0.

Therefore P0 is at saturation region when it is turned on. Cp1, Cp2 . . . Cpk are a set of preset compensation capacitors. When logic high is applied to one or more of the gates of N1, N2 . . . Nk, the corresponding capacitors are selected. At the moment when Vin is transiting from logic low to logic high, the resistor Rgp2 is shorted by the compensation capacitors temporally, the gate voltage of P0 can reach the peak value of Vgp2 at that moment, then the gate voltage of P0 decays to Vgp1.

*Vgp2=Vcc\*Rgp1/(Rgp1+Rgp3)*.

The peak voltage can compensate for the parasitic capacitance of P0 and decrease the current rising time of P0. It should be noted that Vgp2 must meet the requirement of

*Vgp2−Vthp<(Vcc−I0\*Z0)/2 so that P0 is at saturation region*.

While several embodiments and variations of the present invention for a low reflection driver for a high speed simultaneous bi-directional data bus simultaneous bi-directional data bus are described in detail herein, it should be apparent that the disclosure and teachings of the present invention will suggest many alternative designs to those skilled in the art.

Having thus described our invention, what we claim as new and desire to secure by Letters Patent is:

1. A simultaneous bi-directional data bus comprising:
a simultaneous bi-directional data bus having a characteristic impedance Z0;
a first driver unit and receiver unit connected to a first terminal end of the simultaneous bi-directional data bus;
a second driver unit and receiver unit connected to a second terminal end of the simultaneous bi-directional data bus;
each of the first driver unit and the second driver unit having a sourcing current source and a first resistor connected in parallel between a voltage supply and a terminal end of the simultaneous bi-directional data bus, and a sinking current source and a second resistor connected in parallel between a ground and a terminal end of the simultaneous bi-directional data bus, wherein a substantially higher impedance of each current source relative to a substantially lower impedance of each resistor connected in parallel to the current source provides a relatively constant impedance in each driver unit which substantially matches the characteristic impedance of the simultaneous bi-directional data bus.

2. The simultaneous bi-directional data bus of claim 1 where, in each of the first driver unit and the second driver unit, the first resistor of the sourcing current source and the second resistor of the sinking current source is substantially equal to twice the characteristic impedance of the simultaneous bi-directional data bus.

3. The simultaneous bi-directional data bus of claim 1, wherein the sourcing current sources of each of the first driver unit and the second driver unit are identical sourcing current sources, and the sinking current sources of each of the first driver unit and the second driver unit are identical sinking current sources.

4. The simultaneous bi-directional data bus of claim 1, wherein each driver unit comprises a p side driver and an n side driver which are serially connected between a voltage supply and ground, with the connection between the serially connected drivers being connected to the simultaneous bi-directional data bus, and each driver unit has an output impedance of substantially twice the characteristic impedance of the simultaneous bi-directional data bus so that the total output impedance of each driver unit substantially matches the characteristic impedance of the simultaneous bi-directional data bus.

5. The simultaneous bi-directional data bus of claim 1, wherein each driver unit includes a set of programmable compensation capacitors to compensate for parasitic capacitance and to accelerate transitions to higher speeds.

6. The simultaneous bi-directional data bus of claim 1, wherein each sinking current source includes a pfet device, with its gate coupled to an input, coupled to the power supply, with the pfet device being coupled through first, second and third resistors to ground, with a plurality of programmable pfet devices and series connected compensating capacitors being connected in parallel with the second resistor, and the connection between the first and second resistors being connected to the gate of an nfet device.

7. The simultaneous bi-directional data bus of claim 1, wherein each sinking current source includes a pfet device P0s, with its gate coupled to an input Vin, coupled to the power supply Vcc, with the pfet device being coupled through first, second and third resistors Rgn1, Rgn2 and Rgn3 to ground 0V, with a plurality of programmable pfet devices P1, P2, Pk and series connected compensating capacitors Cn1, Cn2, Cnk being connected in parallel with the second resistor Rgn2, and the connection between the first and second resistors Rgn1, Rgn2 being connected to the gate of an nfet device N0, and the gate-source voltage of the nfet device N0 Vgn=Vcc*Rgn2/(Rgn1+Rgn2+Rgn3) when Vin is at logic 0 and P0s is turned on.

8. The simultaneous bi-directional data bus of claim 7, wherein each current source provides the same amount of current I0, and the nfet device N0 and the values of Rgn1, Rgn2 and Rgn3 are chosen to meet the following requirements: the drain to source current Ids of N0 is I0 when Vgn1=Vcc*Rgn1/(Rgn1+Rgn2+Rgn 3), and Vgn1−Vthn, the threshold voltage of N0, <(Vcc−I0*Z0)/2, so that N0 is at a saturation region/mode when turned on.

9. The simultaneous bi-directional data bus of claim 8, wherein when a logic low is applied to one or more of the gates of P1, P2 . . . Pk, the corresponding capacitors are selected, and when Vin is transiting from a logic high to a logic low, the resistor Rgn2 is shorted by the compensation capacitors.

10. The simultaneous bi-directional data bus of claim 1, wherein each sourcing current source includes an nfet device, having its gate coupled to an input coupled to ground, with the nfet device being coupled through first, second and third resistors to the power supply, with a plurality of programmable nfet devices and series connected compensating capacitors being connected in parallel with the second resistor, and the connection between the first and second resistors being connected to the gate of a pfet device.

11. The simultaneous bi-directional data bus of claim 1, wherein each sourcing current source includes an nfet device N0s, having its gate coupled to an input Vin, coupled to ground 0V, with the nfet device being coupled through first, second and third resistors Rgp1, Rgn2, Rgn3 to the power supply Vcc, with a plurality of programmable nfet devices N1, N2, Nk and series connected compensating capacitors Cp1, Cp2, Cpk being connected in parallel with the second resistor Rgp2, and the connection between the first and second resistors being connected to the gate of a pfet device P0, and the gate-source voltage of the pfet P0 Vgp=Vcc*Rgp1/(Rgp1+Rgp2+Rgp3) when Vin is at logic 1 and N0s is turned on.

12. The simultaneous bi-directional data bus of claim 11, wherein each current source provides the same amount of current I0, and the pfet device P0 and the values of Rgp1, Rgp2 and Rgp3 are chosen to meet the following requirements:

the drain to source current Ids of P0 is I0 when Vgp1=Vcc*Rgp1/(Rgp1+Rgp2+Rgp3), and Vgp1−Vthp, the threshold voltage of P0, <(Vcc−I0*Z0)2, so that P0 is at saturation region/mode when turned on.

13. The simultaneous bi-directional data bus of claim 12, wherein when a logic high is applied to one or more of the gates of N1, N2, . . . Nk, the corresponding capacitors are selected, and when Vin is transiting from a logic low to a logic high, the resistor Rgp2 is shorted by the compensation capacitors.

14. A printed circuit board (PCB) communicating over a simultaneous bi-directional data bus having a characteristic impedance Z0, the PCB having a first driver unit and receiver unit connected to a first terminal end of the simultaneous bi-directional data bus, the driver unit having a sourcing current source and a first resistor connected in parallel between a voltage supply and the first terminal end of the simultaneous bi-directional data bus, and a sinking current source and a second resistor connected in parallel between a ground and the first terminal end of the simultaneous bi-directional data bus, wherein a substantially higher impedance of each current source relative to a substantially lower impedance of each resistor connected in parallel to the current source provides a relatively constant impedance in the first driver unit which substantially matches the characteristic impedance of the simultaneous bi-directional data bus.

15. The PCB of claim 14, the PCB further including thereon:

the simultaneous bi-directional data bus;

a second driver unit and receiver unit connected to a second terminal end of the simultaneous bi-directional data bus;

the second driver unit having a sourcing current source and a first resistor connected in parallel between a voltage supply and a second terminal end of the simultaneous bi-directional data bus, and a sinking current source and a second resistor connected in parallel between a ground and the second terminal end of the simultaneous bi-directional data bus, wherein a substantially higher impedance of each current source relative to a substantially lower impedance of each resistor connected in parallel to the current source provides a relatively constant impedance in the second driver unit which substantially matches the characteristic impedance of the simultaneous bi-directional data bus.

16. The PCB of claim 15, where in each of the first driver unit and the second driver unit, the first resistor of the sourcing current source and the second resistor of the sinking current source is substantially equal to twice the characteristic impedance of the simultaneous bi-directional data bus.

17. The PCB of claim 15, wherein the sourcing current sources of each of the first driver unit and the second driver unit are identical sourcing current sources, and the sinking current sources of each of the first driver unit and the second driver unit are identical sinking current sources.

18. The PCB of claim 15, wherein each driver unit comprises a p side driver and an n side driver which are serially connected between a voltage supply and ground, with the connection between the serially connected drivers being coupled to the simultaneous bi-directional data bus, and each driver unit having an output impedance of twice the characteristic impedance of the simultaneous bi-directional data bus so that the total output impedance of each driver unit matches the characteristic impedance of the simultaneous bi-directional data bus.

19. The PCB of claim 15, wherein each driver unit includes a set of programmable compensation capacitors to compensate for parasitic capacitance and to accelerate transitions to higher speeds.

20. A method of transmitting simultaneous bi-directional data over a bus comprising:

providing a simultaneous bi-directional data bus having a characteristic impedance Z0;

connecting a first driver unit and receiver unit to a first terminal end of the simultaneous bi-directional data bus;

connecting a second driver unit and receiver unit to a second terminal end of the simultaneous bi-directional data bus;

substantially matching the characteristic impedance of each of the first driver unit and the second driver unit to the simultaneous bi-directional data bus by providing each of the first driver unit and the second driver unit with a sourcing current source and a first resistor connected in parallel between a voltage supply and a terminal end of the simultaneous bi-directional data bus, and a sinking current source and a second resistor connected in parallel between a ground and a terminal end of the simultaneous bi-directional data bus, wherein a substantially higher impedance of each current source relative to a substantially lower impedance of each resistor connected in parallel to the current source provides a relatively constant impedance in each driver unit which substantially matches the characteristic impedance of the simultaneous bi-directional data bus.

21. The method of claim 20, including, providing in each of the first driver unit and the second driver unit the first resistor of the sourcing current source and the second resistor of the sinking current source with an impedance equal to substantially twice the characteristic impedance of the simultaneous bi-directional data bus.

22. The method of claim 20, including providing the sourcing current sources of each of the first driver unit and the second driver unit as identical sourcing current sources and the sinking current sources of each of the first driver unit and the second driver unit as identical sinking current sources.

23. The method of claim 20, including providing each driver unit as a p side driver and an n side driver which are serially connected between a voltage supply and ground, coupling the connection between the serially connected drivers to the simultaneous bi-directional data bus, and providing each driver unit with an output impedance of substantially twice the characteristic impedance of the simultaneous bi-directional data bus so that the total output impedance of each driver unit substantially matches the characteristic impedance of the simultaneous bi-directional data bus.

24. The method of claim 20, including providing each driver unit with a set of programmable compensation capacitors to compensate for parasitic capacitance and to accelerate transitions to higher speeds.

* * * * *